United States Patent
Rocher et al.

(10) Patent No.: US 12,341,521 B2
(45) Date of Patent: Jun. 24, 2025

(54) DEVICE FOR PROCESSING A PILOT CONTROL SIGNAL

(71) Applicant: Vitesco Technologies GmbH, Regensburg (DE)

(72) Inventors: Jacques Rocher, Toulouse (FR); Frédéric Stuyk, Toulouse (FR)

(73) Assignee: Vitesco Technologies GmbH, Regensburg (DE)

(*) Notice: Subject to any disclaimer, the term of this patent is extended or adjusted under 35 U.S.C. 154(b) by 470 days.

(21) Appl. No.: 17/792,491

(22) PCT Filed: Jan. 22, 2021

(86) PCT No.: PCT/EP2021/051496
§ 371 (c)(1),
(2) Date: Jul. 13, 2022

(87) PCT Pub. No.: WO2021/148631
PCT Pub. Date: Jul. 29, 2021

(65) Prior Publication Data
US 2023/0104496 A1    Apr. 6, 2023

(30) Foreign Application Priority Data
Jan. 24, 2020 (FR) ........................... 2000681

(51) Int. Cl.
*H03K 5/24* (2006.01)
*B60L 53/60* (2019.01)

(52) U.S. Cl.
CPC ............... *H03K 5/24* (2013.01); *B60L 53/60* (2019.02)

(58) Field of Classification Search
None
See application file for complete search history.

(56) References Cited

U.S. PATENT DOCUMENTS

| | | | | |
|---|---|---|---|---|
| 5,229,818 A | * | 7/1993 | Nakahara | G03G 15/0266 399/46 |
| 6,047,634 A | * | 4/2000 | Futsuhara | H03K 17/18 100/48 |
| 2002/0008629 A1 | * | 1/2002 | Jinno | G08G 1/097 340/642 |
| 2010/0102512 A1 | * | 4/2010 | Dar | F41J 9/18 273/362 |
| 2013/0175988 A1 | | 7/2013 | Ghabbour et al. | |
| 2013/0320922 A1 | | 12/2013 | Acena et al. | |
| 2014/0312853 A1 | | 10/2014 | Dreina | |
| 2016/0315478 A1 | * | 10/2016 | Chen | H02M 7/06 |
| 2017/0300098 A1 | * | 10/2017 | Sen | G06F 3/03543 |

OTHER PUBLICATIONS

International Search Report and Written Opinion for International Application No. PCT/EP2021/051496, dated Apr. 1, 2021, 10 pages.
International Search Report and Written Opinion for International Application No. PCT/EP2021/051496, dated Apr. 1, 2021, 15 pages (French).

* cited by examiner

*Primary Examiner* — Kenneth B Wells
(74) *Attorney, Agent, or Firm* — Buchanan Ingersoll & Rooney PC

(57) ABSTRACT

A device capable of processing a pilot control signal having at least two modes: continuous or alternating PWM, and of generating a binary detection signal, the state of which is an indication of the mode, the device having a voltage doubler and a comparator.

7 Claims, 2 Drawing Sheets

DEVICE FOR PROCESSING A PILOT CONTROL SIGNAL

CROSS REFERENCE TO RELATED APPLICATIONS

This application is the U.S. National Phase Application of PCT International Application No. PCT/EP2021/051496, filed Jan. 22, 2021, which claims priority to French Patent Application No. 2000681, filed Jan. 24, 2020, the contents of such applications being incorporated by reference herein.

FIELD OF THE INVENTION

The invention relates to the field of motor vehicle electronics. More particularly, the invention addresses the problem of detecting a PWM alternation in a pilot control signal.

BACKGROUND OF THE INVENTION

The standard IEC 61851, incorporated herein by reference, defines the features of a pilot control signal CP. This pilot control signal CP is used between an electric vehicle and a charging station in order to exchange information.

As illustrated in FIG. 1, this pilot control signal CP can take different modes.

The electric vehicle varies the max voltage level to reflect its mode. A max voltage of +12V thus indicates that there is no connection between the electric vehicle and the charging station. After connecting the electric vehicle to the charging station, the max voltage is +9V while charging is not in effect and +6V when the vehicle activates charging.

The charging station varies the frequency to reflect its mode. The signal is thus continuous while the charging station is not ready to charge and becomes an alternating PWM (pulse width modulation) signal when the charging station is ready to charge.

Since the modes of the electric vehicle and of the charging station are carried by modalities of different natures (amplitude and frequency), they can be combined. Thus, as illustrated in FIG. 1, the pilot control signal CP can take the following different modes. M1: the electric vehicle and the charging station are disconnected: the signal has a max voltage of +12V indicating disconnection and is continuous indicating that the charging station is not ready to charge. M2: the signal has a max voltage of +9V indicating connection and that the electric vehicle is not charging, and is continuous indicating that the charging station is not ready. M3: the signal becomes an alternating PWM signal indicating that the charging station is ready to charge. M4: the signal has a max voltage of +6V indicating that the electric vehicle is charging and is an alternating PWM signal indicating that the charging station is capable of charging. M5: the signal again becomes continuous indicating that the charging station is no longer capable of charging. M6: the max voltage goes from +6V to +9V indicating that the electric vehicle has stopped charging. M7: the signal again becomes an alternating PWM signal indicating that the charging station is once again ready to charge. M8: the max voltage goes from +9V to +6V indicating that the electric vehicle has resumed charging. M9: the max voltage goes from +6V to +9V indicating that the electric vehicle has stopped charging. M10: the max voltage goes from +9V to +12V indicating disconnection.

SUMMARY OF THE INVENTION

The electric vehicle has a computer on board, one of the functions of which is to manage charging. This computer is asleep when it is not being used. The problem addressed by an aspect of the invention is that of waking up this computer when charging needs to be performed. This happens when the electric vehicle is connected to the charging station and the charging station is capable of charging. Thus, an aim of the invention is to generate a signal, typically a continuous signal, that is capable of waking up the computer upon detecting the presence of an alternating PWM signal in the pilot control signal CP. Before the electric vehicle is connected to the charging station, it is in standby mode. Since this standby mode can last a very long time in the event of prolonged non-use of the vehicle, it is highly desirable for the detection of the alternating PWM signal not to consume any energy from the electric vehicle.

In order to solve this problem, the device for processing the pilot control signal CP according to an aspect of the invention is such that it draws the energy required for detecting the alternating PWM signal from the pilot control signal CP itself.

To achieve this, one aspect of the invention is to provide a device for processing a pilot control signal having at least two modes: continuous or alternating PWM, and for generating a binary detection signal, the state of which is an indication of the mode, wherein the device comprises a voltage doubler and a comparator.

Particular features or embodiments, which may be used alone or in combination, are:

the pilot control signal is as defined by the standard IEC 61851, the voltage doubler is a Greinacher voltage doubler, the Greinacher voltage doubler comprises a first capacitor, of which a first terminal is connected to an input of the voltage doubler and of the device capable of receiving the pilot control signal, a first diode, of which the anode is connected to ground and the cathode is connected to a second terminal of the first capacitor, a second diode, of which the anode is connected to the cathode of the first diode and the cathode is connected to an output of the voltage doubler, a second capacitor, of which a first terminal is connected to the output of the voltage doubler and a second terminal is connected to ground, and a resistor, of which a first terminal is connected to the output of the voltage doubler and a second terminal is connected to ground, the comparator comprises a Zener diode, of which the cathode is connected to the output of the voltage doubler and to the input of the comparator, the comparator further comprises a first transistor of NPN type, of which the base is connected to the anode of the Zener diode and the emitter is connected to ground, and a second transistor of PNP type, of which the base is connected to the collector of the first transistor, the emitter is connected to a supply voltage and the collector is connected to the output of the comparator and of the device and generates the detection signal.

In a second aspect, the invention relates to the application to waking up a computer for an electric vehicle, when the electric vehicle is connected to an active charging station.

BRIEF DESCRIPTION OF THE DRAWINGS

An aspect of the invention will be better understood from reading the following description, given solely by way of example, and with reference to the appended figures, in which.

DESCRIPTION OF THE EMBODIMENTS

Figure 4:
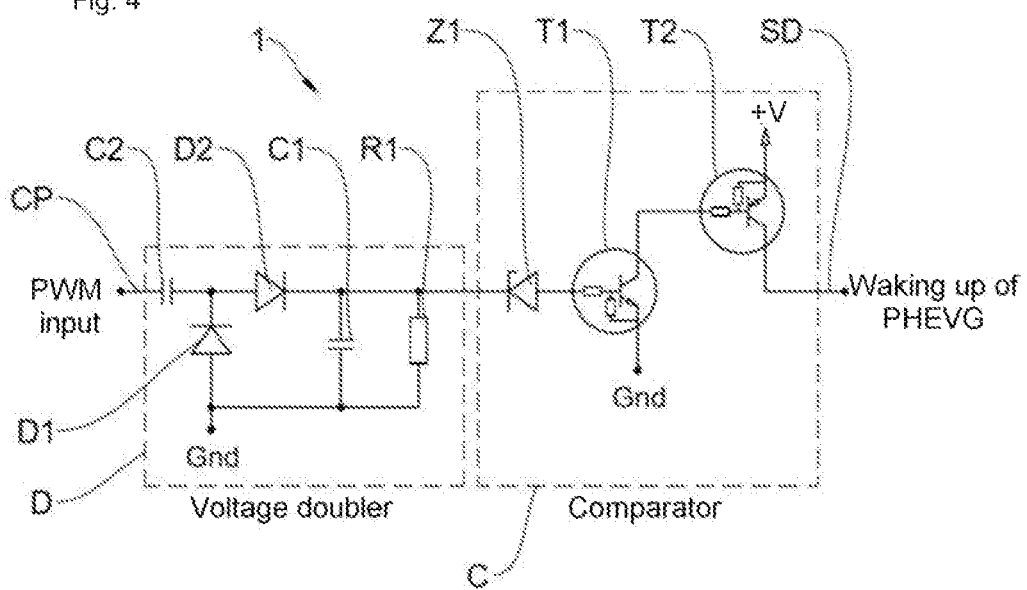
FIG. 4 depicts one embodiment of a device according to the invention.

With reference to FIG. 4, showing one embodiment, the invention relates to a device 1 capable of processing a pilot control signal CP. Such a pilot control signal CP has, as described above for example, at least two modes: continuous or alternating PWM. This signal CP is applied at the input of the device 1. The device 1 processes this signal in order to detect the presence or absence of a PWM alternation. The device 1 generates a detection signal SD at the output. This detection signal is binary, that is to say it has two states, and its state is an indication of the mode: presence of a PWM alternation or absence of a PWM alternation, the pilot control signal CP being continuous.

Knowing, as detailed above, that it is desired to have low or no standby power consumption by the device 1, the latter is designed to be powered by the pilot control signal CP itself.

To achieve this, it has been found that reusing a known circuit, but for a totally different application, could advantageously address the stated problem. Specifically, a circuit, the family of which is generically known under the name of voltage doubler D, advantageously allows, when combined with a comparator C, the desired function to be performed.

As its name suggests, a voltage doubler D is a circuit which allows a voltage that is equal to twice the input voltage to be obtained at the output. More particularly, a voltage doubler D transforms an alternating voltage oscillating between −V and +V into an alternating voltage oscillating between 0 and 2V. To achieve this, capacitors and active elements (diode, transistor, etc.) are used.

Figure 1:
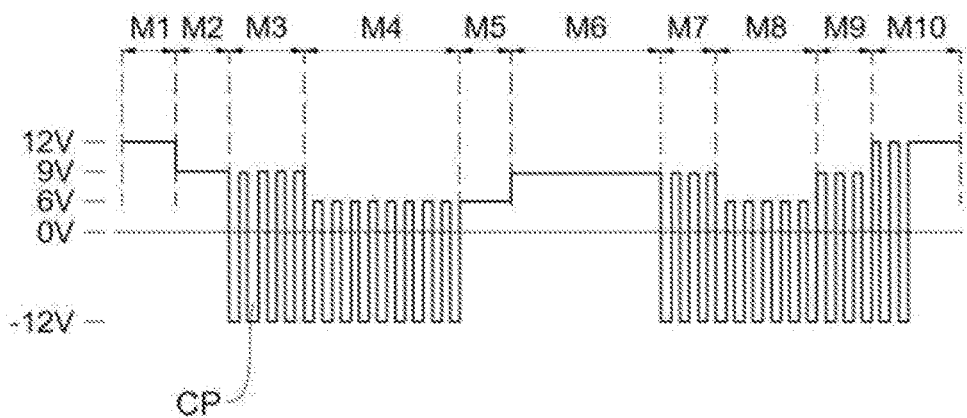
FIG. 1 already described, illustrates a pilot control signal.
Figure 2:
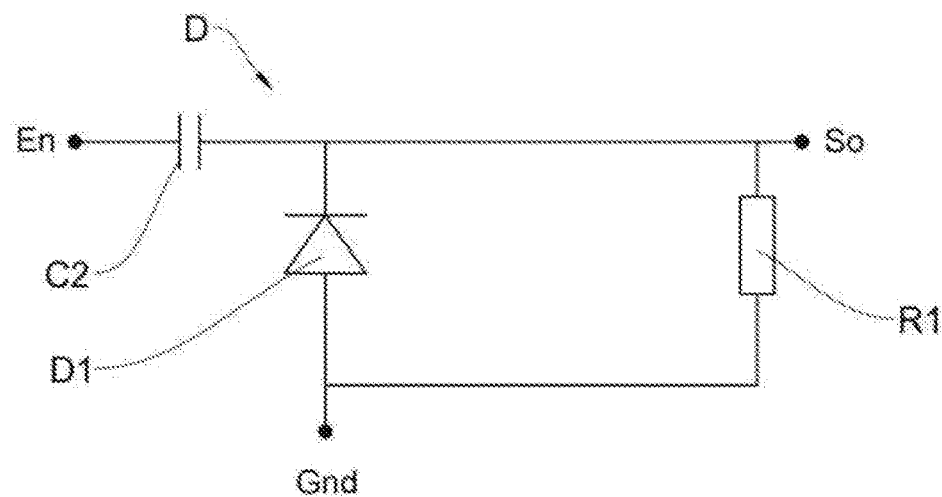
FIG. 2 depicts a Villard voltage doubler.

The principle of a voltage doubler can be illustrated by the simplest voltage doubler of the family, the Villard voltage doubler, illustrated in FIG. 2. This circuit comprises a capacitor C2 in series, that is to say between the input En and the output So, and a diode D1 in parallel, that is to say its cathode is connected to the capacitor C2 on the output side So and its anode is connected to ground. Ground is denoted by Gnd in the diagrams. The capacitor C2 is charged during the negative half-cycle at the maximum amplitude +V of the alternating voltage supplied at input En. The output voltage So is equal to the alternating input voltage to which the constant voltage +V from the capacitor C2 is added. The resistor R1, which does not strictly speaking belong to the Villard voltage doubler, allows the capacitor C2 to be discharged between two detections.

According to an aspect of the invention, a voltage doubler D is not directly used for the function of doubling. An aspect of the invention seeks to discriminate a continuous signal from an alternating PWM signal. The capacitor C2 in series at the input, present in all the voltage doublers D of the family, ensures suppression of the continuous signal. Conversely, in the presence of an alternating signal at input En, cumulative charging of the capacitor C2, at each negative half-cycle, makes it possible, within an adjustable time, to generate a voltage that has a certain value, so as not to be confused with a parasitic element, and thus capable of exceeding a threshold determined by the comparator C. Said cumulative charging ensures that a certain value can be reached, if necessary while requiring more time, including with a very unbalanced PWM duty cycle charging the capacitor C2 only slightly.

Thus, it appears that all the voltage doublers D of the family are capable of being used for an aspect of the invention. By way of illustration, mention may be made of: a Villard voltage doubler, a Greinacher voltage doubler, a Delon voltage doubler, a charge pump voltage doubler, a Dickson voltage doubler, etc.

Figure 3:
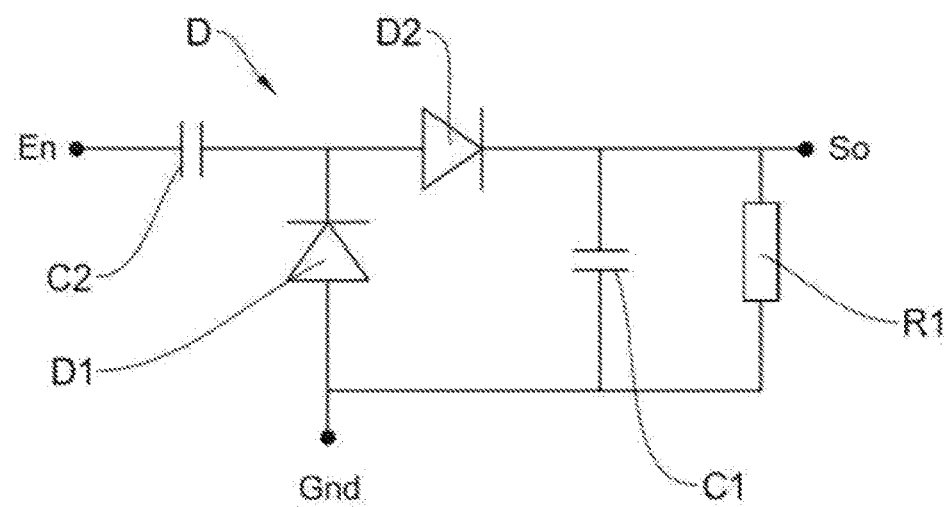
FIG. 3 depicts a Greinacher voltage doubler.

According to another feature of an aspect of the invention, the Greinacher voltage doubler, illustrated in FIG. 3, is preferred.

A Greinacher voltage doubler is a Villard voltage doubler supplemented by a peak detector, comprising a second diode D2 and a second capacitor C1. This peak detector allows the oscillations of the output voltage So to be limited. Thus, it provides greater robustness with regard to the problem addressed and in particular in the event of a very unbalanced duty cycle, by avoiding a possible "bell effect". Such a voltage doubler D nonetheless remains simple in that it only requires two diodes and two capacitors. Here again, the resistor R1, which does not strictly speaking belong to the Greinacher voltage doubler, allows the capacitor C2 to be discharged between two detections.

According to another feature, the device 1 according to an aspect of the invention is applied to a pilot control signal CP as defined by the standard IEC 61851.

The doubler D receives the voltage signal CP at its input and generates the intermediate voltage signal IN at output. The comparator C receives said intermediate voltage signal IN at input and generates the detection voltage signal SD at output.

According to another feature, with reference to FIG. 3 or 4, a Greinacher voltage doubler comprises a first capacitor C2, of which a first terminal is connected to an input of the voltage doubler D and of the device 1 capable of receiving the pilot control signal CP, a first diode D1, of which the anode is connected to ground and the cathode is connected to a second terminal of the first capacitor C2, a second diode D2, of which the anode is connected to the cathode of the first diode D1 and the cathode is connected to an output of the voltage doubler D (which is also an input of the comparator C), a second capacitor C1, of which a first terminal is connected to the output of the voltage doubler D and a second terminal is connected to ground, and a resistor R1, of which a first terminal is connected to the output of the voltage doubler D and a second terminal is connected to ground.

According to another feature, the comparator C comprises a Zener diode Z1 in series, of which the cathode is connected to the output of the voltage doubler D and to the input of the comparator C. Said Zener diode Z1 primarily ensures the comparison/detection function. The characteristic voltage of this Zener diode Z1 is such that it detects a PWM signal even of lower voltage amplitude, while rejecting possible parasitic elements. The lowest voltage amplitude is between −12V and +3V, that is to say 15V. Thus, a satisfactory characteristic voltage of the Zener diode Z1 is here taken equal to 7.5V.

The comparator C further comprises a first transistor T1, of NPN type, of which the base is connected to the anode of the Zener diode Z1 and the emitter is connected to ground. This first transistor T1 ensures, by performing a switching operation, binarization of the detection signal SD and performs, along with the Zener diode Z1, the comparison/detection function. A second transistor T2, of PNP type, of which the base is connected to the collector of the first transistor T1, the emitter is connected to a supply voltage V and the collector is connected to the output of the comparator C and of the device 1 and generates the detection signal SD. This second transistor T2 more particularly ensures level adaptation: the detection signal SD generated is thus binary with a state at 0V (ground) in the absence of a PWM signal and a state at the voltage V in the presence of a PWM signal. The voltage V is thus chosen depending on the need of the signal SD.

Figure 5:
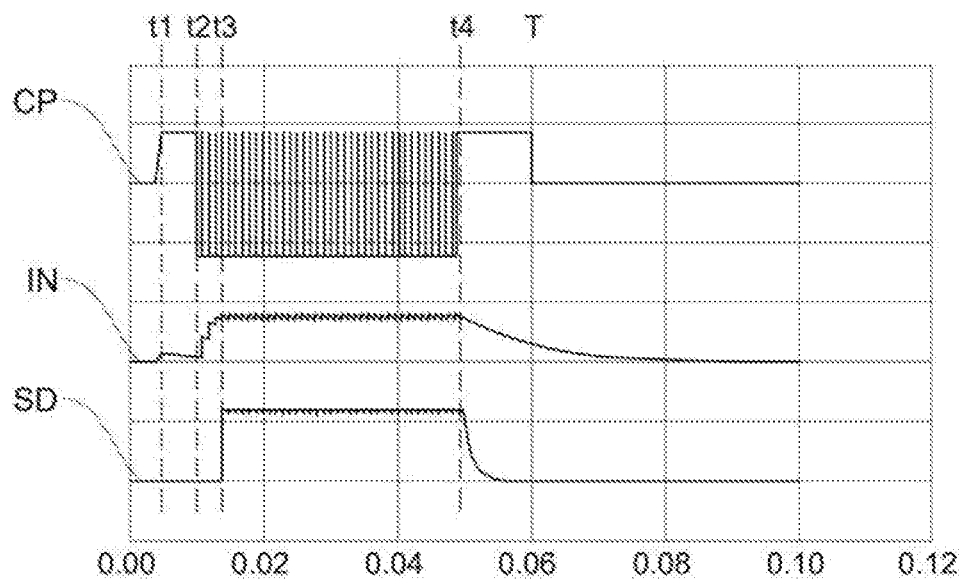
FIG. 5 shows a diagram comparing the various signals.

With reference to FIG. 5, the behavior of the device 1 according to the circuit of FIG. 4 is illustrated. The diagram shows voltages on the ordinate as a function of time on the abscissa. The three curves are synchronous so that they can be compared. They have been offset vertically to improve comparative readability. The curve IN is offset by 30V and the curve SD by 50V.

The signal CP is initially continuous with a value of 0V. At t1, CP switches, still being continuous, to a value of +9V. It can be observed that IN rises very slightly, from a value of 0V, in response but this does not last and then decreases again. SD is not affected on account of its input threshold conferred by Z1. Then, at t2, CP becomes a PWM signal with a variation between −12V and +9V. It can be observed that the response of IN increases gradually with each cycle of the alternation. This increase may be more or less rapid depending on the duty cycle of the PWM. However, after a few cycles, t3 is reached, at which point the voltage IN reaches and exceeds the threshold of the comparator, leading to a change of state of SD which, from 0V, switches to the voltage +V. Such as 12V, for example. With a PWM oscillating between −12V and +9V, the signal IN reaches a value which oscillates between 7.2 and 8.1V and which allows the state of the Zener diode Z1 to be modified. At t4, the PWM stops and CP becomes continuous again. This is followed by a drop in IN, quickly detected by the comparator C, which leads to a change of state of SD, which switches back to 0V.

The time on the abscissa, expressed in seconds, illustrates the response time, of the order of $1/100^{th}$, of the device 1.

According to one advantageous embodiment, the device 1 is used for waking up a computer for an electric vehicle, when the electric vehicle is connected to an active charging station. This connection conveys a pilot control signal CP. This signal CP is supplied to the device 1, which is arranged on the vehicle side and which detects the presence of an alternating PWM signal when the charging station is ready and generates a detection signal SD capable of waking up the computer. The device 1 does not require any power supply to perform the detection and thus consumes nothing during all the standby/waiting phases. The vehicle battery is not used. The power supply +V, which supplies the second transistor T2, is only used for adapting the level of the detection signal SD, once said detection has been performed. The device 1 thus consumes no power when on standby.

Throughout this patent application, electric vehicle includes hybrid vehicle.

The invention has been illustrated and described in detail in the drawings and the description above. This should be considered as illustrative and given by way of example and not as limiting the invention to this description only. Many variant embodiments are possible.

LIST OF REFERENCE SIGNS

1: device,
C: comparator,
C1, C2: capacitor,
CP: pilot control signal,
D: voltage doubler,
D1, D2: diode,
En: input,
Gnd: ground,
IN: intermediate signal,
M1-M10: modes,
R1: resistor,
SD: detection signal,
So: output,
t1-t4: times,
T1, T2: transistors.

The invention claimed is:

1. A device for processing a pilot control signal, the device comprising:
   a voltage doubler; and
   a comparator,
   the pilot control signal having at least two modes: a continuous mode in which the pilot control signal comprises a continuous signal or an alternating mode in which the pilot control signal comprises an alternating PWM signal, and
   the comparator outputs a binary detection signal based on an input of the pilot control signal to the voltage doubler, a state of the binary detection signal being an indication of the mode of the pilot control signal.

2. The device as claimed in claim 1, in which the pilot control signal is as defined by the standard IEC 61851.

3. The device as claimed in claim 1, in which the voltage doubler is a Greinacher voltage doubler.

4. The device as claimed in claim 3, in which the Greinacher voltage doubler comprises a first capacitor, of which a first terminal is connected to an input of the voltage doubler and of the device capable of receiving the pilot control signal, a first diode, of which the anode is connected to ground (Gnd) and the cathode is connected to a second terminal of the first capacitor, a second diode, of which the anode is connected to the cathode of the first diode and the cathode is connected to an output of the voltage doubler, a second capacitor, of which a first terminal is connected to the output of the voltage doubler and a second terminal is connected to ground, and a resistor, of which a first terminal is connected to the output of the voltage doubler and a second terminal is connected to ground.

5. The device as claimed in claim 1, in which the comparator comprises a Zener diode, of which the cathode is connected to the output of the voltage doubler and to the input of the comparator.

6. A device for processing a pilot control signal having at least two modes: a continuous mode in which the pilot control signal comprises a continuous signal or an alternating mode in which the pilot control signal comprises an alternating PWM signal, and capable of generating a binary detection signal, the state of which is an indication of the mode, the device comprising:
   a voltage doubler; and
   a comparator,
   the comparator further comprising:
   a Zener diode, the cathode of which is connected to the output of the voltage doubler and to the input of the comparator, and
   a first transistor of NPN type, the base of which is connected to the anode of the Zener diode and the emitter is connected to ground, and a second transistor of PNP type, the base of which is connected to the collector of the first transistor, the emitter is connected to a supply voltage and the collector is connected to the output of the comparator and of the device and generates the detection signal.

7. An application of waking up a computer for an electric vehicle, when the electric vehicle is connected to an active charging station using a device for processing a pilot control signal having at least two modes: a continuous mode in which the pilot control signal comprises a continuous signal or an alternating mode in which the pilot control signal comprises an alternating PWM signal, and capable of generating a binary detection signal, the state of which is an indication of the mode, the device comprising a voltage doubler and a comparator.

\* \* \* \* \*